US012658550B2

(12) United States Patent
Seler et al.

(10) Patent No.: US 12,658,550 B2
(45) Date of Patent: Jun. 16, 2026

(54) CHIP PACKAGES INCLUDING SUBSTRATE INTEGRATED WAVEGUIDES

(71) Applicant: Infineon Technologies AG, Neubiberg (DE)

(72) Inventors: Ernst Seler, Munich (DE); Tuncay Erdöl, Unterhaching (DE); Ulrich Möeller, Holzkirchen (DE)

(73) Assignee: Infineon Technologies AG, Neubiberg (DE)

( * ) Notice: Subject to any disclaimer, the term of this patent is extended or adjusted under 35 U.S.C. 154(b) by 111 days.

(21) Appl. No.: 18/665,349

(22) Filed: May 15, 2024

(65) Prior Publication Data

US 2024/0396198 A1 Nov. 28, 2024

(30) Foreign Application Priority Data

May 22, 2023 (DE) .......................... 102023204741.1

(51) Int. Cl.
H01P 3/12 (2006.01)
H01P 3/02 (2006.01)
(Continued)

(52) U.S. Cl.
CPC .............. H01P 3/121 (2013.01); H01P 3/023 (2013.01); H01P 5/1015 (2013.01);
(Continued)

(58) Field of Classification Search
CPC ........ H01P 3/121; H01P 3/023; H01P 5/1015; H01P 5/107; H01P 1/208; H01P 1/203; H01P 1/207; H01P 1/2088; H01P 1/20; H01P 5/12; H01P 5/08; H01P 3/081;

H01P 5/184; H01P 5/16; H01P 1/2002; H01P 5/024; H01P 3/18; H01P 7/065; H01P 5/10; H01P 7/06; H01P 7/10; H01P 1/212;
(Continued)

(56) References Cited

U.S. PATENT DOCUMENTS

2015/0333726 A1 11/2015 Xue et al.
2017/0048969 A1* 2/2017 Qiang ....................... H05K 1/09
(Continued)

FOREIGN PATENT DOCUMENTS

GB 2499792 A 9/2013
WO 2021099119 A1 5/2021

OTHER PUBLICATIONS

Huang, Ting-Yi, et al., "Design and Modeling of Microstrip Line to Substrate Integrated Waveguide Transitions," Passive Microwave Components and Antennas, Vitaliy Zhurbenko, InTech, 2010, ch 11, S 225-246.

*Primary Examiner* — John W Poos
(74) *Attorney, Agent, or Firm* — Harrity & Harrity, LLP

(57) ABSTRACT

A chip package includes a semiconductor chip and a substrate integrated waveguide. The substrate integrated waveguide includes a first metal layer, a second metal layer arranged over the first metal layer and a dielectric substrate arranged between the first metal layer and the second metal layer. The chip package further includes a slot formed in the second metal layer and a signal line electrically coupling the semiconductor chip and the second metal layer. The signal line crosses the slot when viewed in a direction perpendicular to the second metal layer.

19 Claims, 3 Drawing Sheets

(51) Int. Cl.
  *H01P 5/10* (2006.01)
  *H10W 20/42* (2026.01)
  *H10W 90/00* (2026.01)
(52) U.S. Cl.
  CPC ......... *H10W 20/42* (2026.01); *H10W 90/701*
    (2026.01); *H10W 90/725* (2026.01); *H10W*
    *90/755* (2026.01)
(58) Field of Classification Search
  CPC ...... H01P 7/00; H01P 11/007; H01P 1/20309;
    H01P 11/002; H01P 3/16; H01P 5/087;
    H01P 5/188; H01P 5/20; H01P 1/20318;
    H01P 3/12; H01P 5/181; H01P 1/025;
    H01P 1/027; H01P 3/00; H01P 3/006;
    H01P 5/022; H01P 5/182; H01P 3/026;
    H01P 3/08; H01P 5/082; H01P 5/1007;
    H01P 7/082; H01P 1/201; H01P 1/2133;
    H01P 1/2138; H01P 1/222; H01P 1/227;
    H01P 11/008; H01P 3/003; H01P 5/02;
    H01P 5/183; H01P 7/04; H01P 7/105;
    H01P 1/20327; H01P 1/211; H01P 1/22;
    H01P 1/387; H01P 11/003; H01P 11/005;
    H01P 3/06; H01P 3/082; H01P 3/123;
    H01P 5/18; H01P 9/003; H01P 1/042;
    H01P 1/127; H01P 1/18; H01P 1/181;
    H01P 1/19; H01P 1/2013; H01P 1/20336;
    H01P 1/209; H01P 11/001; H01P 3/02;
    H01P 5/00; H01P 5/04; H01P 5/103;
    H01P 1/04; H01P 1/161; H01P 1/163;
    H01P 1/184; H01P 1/2005; H01P
    1/20345; H01P 1/20381; H01P 1/205;
    H01P 1/2086; H01P 1/2135; H01P
    1/2136; H01P 1/217; H01P 1/218; H01P
    1/36; H01P 7/08; H01P 7/088; H01P
    9/00; H01L 23/49816; H01L 23/5226;
    H01L 24/16; H01L 24/48; H01L
    2224/16157; H01L 2224/48157; H01L
    2924/19031; H01L 2924/20271; H01L
    23/66; H01L 21/67121; H01L 2223/6611;
    H01L 2223/6627; H01Q 1/38; H01Q
    1/50; H01Q 1/48; H01Q 1/36; H01Q
    13/10; H01Q 21/0006; H01Q 21/00;
    H01Q 21/065; H01Q 1/52; H01Q 21/24;
    H01Q 9/0407; H01Q 13/18; H01Q 1/241;
    H01Q 9/045; H01Q 13/106; H01Q 15/24;
    H01Q 1/521; H01Q 15/0086; H01Q
    9/0414; H01Q 21/061; H01Q 1/2283;
    H01Q 1/002; H01Q 1/22; H01Q 21/0087;
    H01Q 1/523; H01Q 5/50; H01Q 13/02;
    H01Q 21/0075; H01Q 5/20; H01Q 21/06;
    H01Q 21/064; H01Q 21/08; H01Q 23/00;
    H01Q 1/526; H01Q 3/34; H01Q 3/36;
    H01Q 1/243; H01Q 13/08; H01Q 9/0485;
    H01Q 1/24; H01Q 5/28; H01Q 9/0457;
    H01Q 3/30; H01Q 5/10; H01Q 5/307;
    H01Q 9/16; H01Q 9/0428; H01Q 13/00;
    H01Q 13/20; H01Q 15/14; H01Q 21/28;
    H01Q 1/32; H01Q 13/206; H01Q 19/06;
    H01Q 3/00; H01Q 1/246; H01Q 21/30;
    H01Q 9/0442; H01Q 15/0053; H01Q
    21/005; H01Q 21/062; H01Q 1/3233;
    H01Q 13/06; H01Q 15/0026; H01Q
    19/10; H01Q 21/0043; H01Q 9/285;
    H01Q 1/12; H01Q 1/42; H01Q 13/103;
    H01Q 21/0093; H01Q 25/002; H01Q
    25/04; H01Q 3/26; H01Q 5/55; H01Q
    15/0013; H01Q 21/0037; H01Q 21/29;
    H01Q 5/335; H01Q 9/0464; H01Q 1/422;
    H01Q 13/28; H01Q 15/02; H01Q
    21/0025; H01Q 5/30; H01Q 5/42; H01Q
    1/2266; H01Q 1/28; H01Q 13/0225;
    H01Q 13/16; H01Q 13/22; H01Q 15/002;
    H01Q 21/067; H01Q 3/44; H01Q 3/443;
    H01Q 5/00; H01Q 5/321; H01Q 1/02;
    H01Q 15/006; H01Q 19/30; H01Q 25/02;
    H01Q 3/38; H01Q 5/392; H01Q 5/45;
    H01Q 9/0492; H01Q 1/20; H01Q 1/2225;
    H01Q 1/2258; H01Q 1/242; H01Q 1/273;
    H01Q 15/008; H01Q 15/16; H01Q
    15/244; H01Q 19/02; H01Q 19/09; H01Q
    21/0031; H01Q 21/0062; H01Q 21/0068;
    H01Q 3/2605; H01Q 5/342; H01Q 5/378;
    H01Q 5/40; H01Q 7/00; H01Q 9/065;
    H01Q 9/26; H01Q 1/1271; H01Q 1/27;
    H01Q 1/288; H01Q 13/12; H01Q 15/08;
    H01Q 19/005; H01Q 19/062; H01Q
    19/104; H01Q 21/205; H01Q 21/22;
    H01Q 21/245; H01Q 21/293; H01Q
    25/001; H01Q 25/005; H01Q 3/2694;
    H01Q 3/40; H01Q 5/25; H01Q 5/385;
    H01Q 9/04; H01Q 9/0421; H01Q 9/30;
    H01Q 9/40; H01Q 9/42; H01Q 1/007;
    H01Q 1/2208; H01Q 1/2291; H01Q
    1/3208; H01Q 1/34; H01Q 1/44; H01Q
    1/46; H01Q 1/525; H01Q 13/0233; H01Q
    15/004; H01Q 15/0066; H01Q 15/242;
    H01Q 17/00; H01Q 19/185; H01Q 21/12;
    H01Q 21/20; H01Q 3/22; H01Q 3/24;
    H01Q 3/28; H01Q 3/32; H01Q 5/314;
    H01Q 9/0435; H01Q 9/06; H10W 44/20;
    H10W 44/216; H10W 44/209; H10W
    44/251; H10W 70/685; H10W 90/724;
    H10W 44/248; H10W 70/65; H10W
    44/206; H10W 44/226; H10W 44/241;
    H10W 70/05; H10W 70/09; H10W
    70/095; H10W 70/60; H10W 74/01;
    H10W 74/114; H10W 90/701; H10W
    20/20; H10W 20/42; H10W 44/219;
    H10W 72/923; H10W 72/941; H10W
    80/016; H10W 90/00; H10W 90/725;
    H10W 90/755; H10W 90/792; H10W
    20/0234; H10W 20/212; H10W 20/2125;
    H10W 20/496; H10W 42/20; H10W
    70/635; H10W 70/655; H10W 72/072
  See application file for complete search history.

(56) References Cited

U.S. PATENT DOCUMENTS

| | | | |
|---|---|---|---|
| 2019/0207286 A1 | 7/2019 | Moallem | |
| 2020/0006833 A1 | 1/2020 | Lynch et al. | |
| 2020/0235453 A1* | 7/2020 | Lang ..................... H05K 1/181 | |
| 2022/0247089 A1 | 8/2022 | Hartner et al. | |
| 2022/0415830 A1* | 12/2022 | Erdoel ................ H01Q 1/2283 | |
| 2023/0352315 A1* | 11/2023 | Tang ................ H01L 23/49822 | |

* cited by examiner

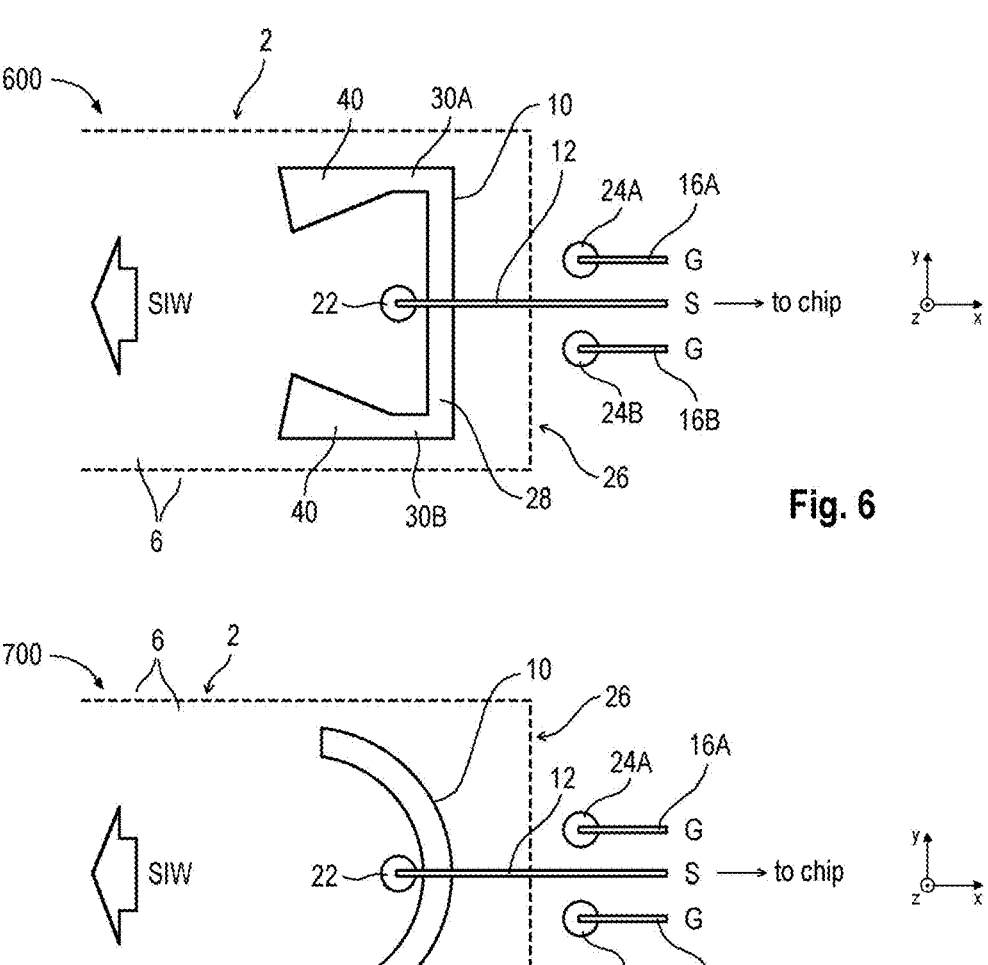

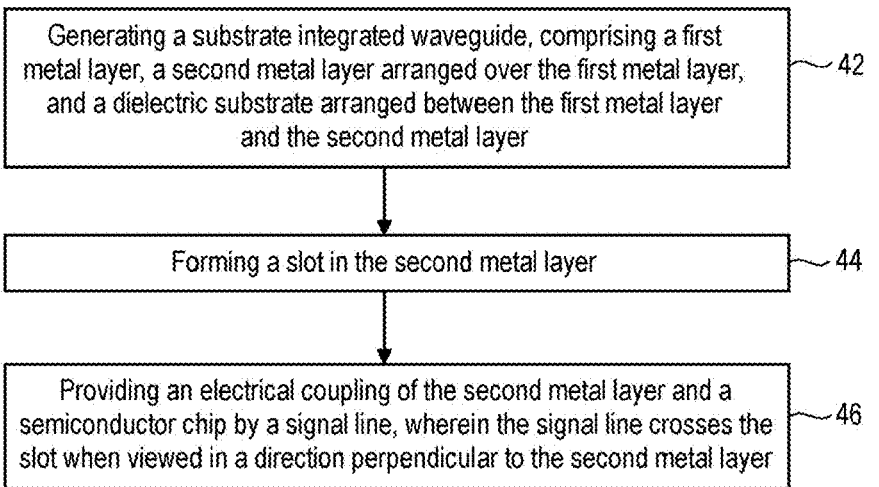

Generating a substrate integrated waveguide, comprising a first metal layer, a second metal layer arranged over the first metal layer, and a dielectric substrate arranged between the first metal layer and the second metal layer ~ 42

Forming a slot in the second metal layer ~ 44

Providing an electrical coupling of the second metal layer and a semiconductor chip by a signal line, wherein the signal line crosses the slot when viewed in a direction perpendicular to the second metal layer ~ 46

Fig. 8

CHIP PACKAGES INCLUDING SUBSTRATE INTEGRATED WAVEGUIDES

CROSS-REFERENCE TO RELATED APPLICATION

This application claims priority to German Patent Application No. 102023204741.1 filed on May 22, 2023, the content of which is incorporated by reference herein in its entirety.

TECHNICAL FIELD

The present disclosure relates to chip packages including substrate integrated waveguides and methods for manufacturing such chip packages.

BACKGROUND

In radio frequency applications, such as e.g., radar systems, a transition from chip to antenna technology may be critical with regard to performance and cost. Manufacturers and developers of chip packages used for radio frequency applications are constantly striving to improve their products. In this regard, it may be desirable to provide chip packages with improved performance and lower cost. In addition, it may be desirable to provide suitable methods for manufacturing such chip packages.

SUMMARY

An aspect of the present disclosure relates to a chip package. The chip package includes a semiconductor chip and a substrate integrated waveguide. The substrate integrated waveguide includes a first metal layer, a second metal layer arranged over the first metal layer and a dielectric substrate arranged between the first metal layer and the second metal layer. The chip package further includes a slot formed in the second metal layer and a signal line electrically coupling the semiconductor chip and the second metal layer. The signal line crosses the slot when viewed in a direction perpendicular to the second metal layer.

A further aspect of the present disclosure relates to a method for manufacturing a chip package. The method includes an act of generating a substrate integrated waveguide. The substrate integrated waveguide includes a first metal layer, a second metal layer arranged over the first metal layer and a dielectric substrate arranged between the first metal layer and the second metal layer. The method further includes an act of forming a slot in the second metal layer. The method further includes an act of providing an electrical coupling of the second metal layer and a semiconductor chip by a signal line. The signal line crosses the slot when viewed in a direction perpendicular to the second metal layer.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

FIG. 6 schematically illustrates a top view of a chip package 600, in accordance with the disclosure.

FIG. 7 schematically illustrates a top view of a chip package 700, in accordance with the disclosure.

FIG. 8 illustrates a flowchart of a method for manufacturing a chip package, in accordance with the disclosure.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

Figures 1A, 1B, 2:
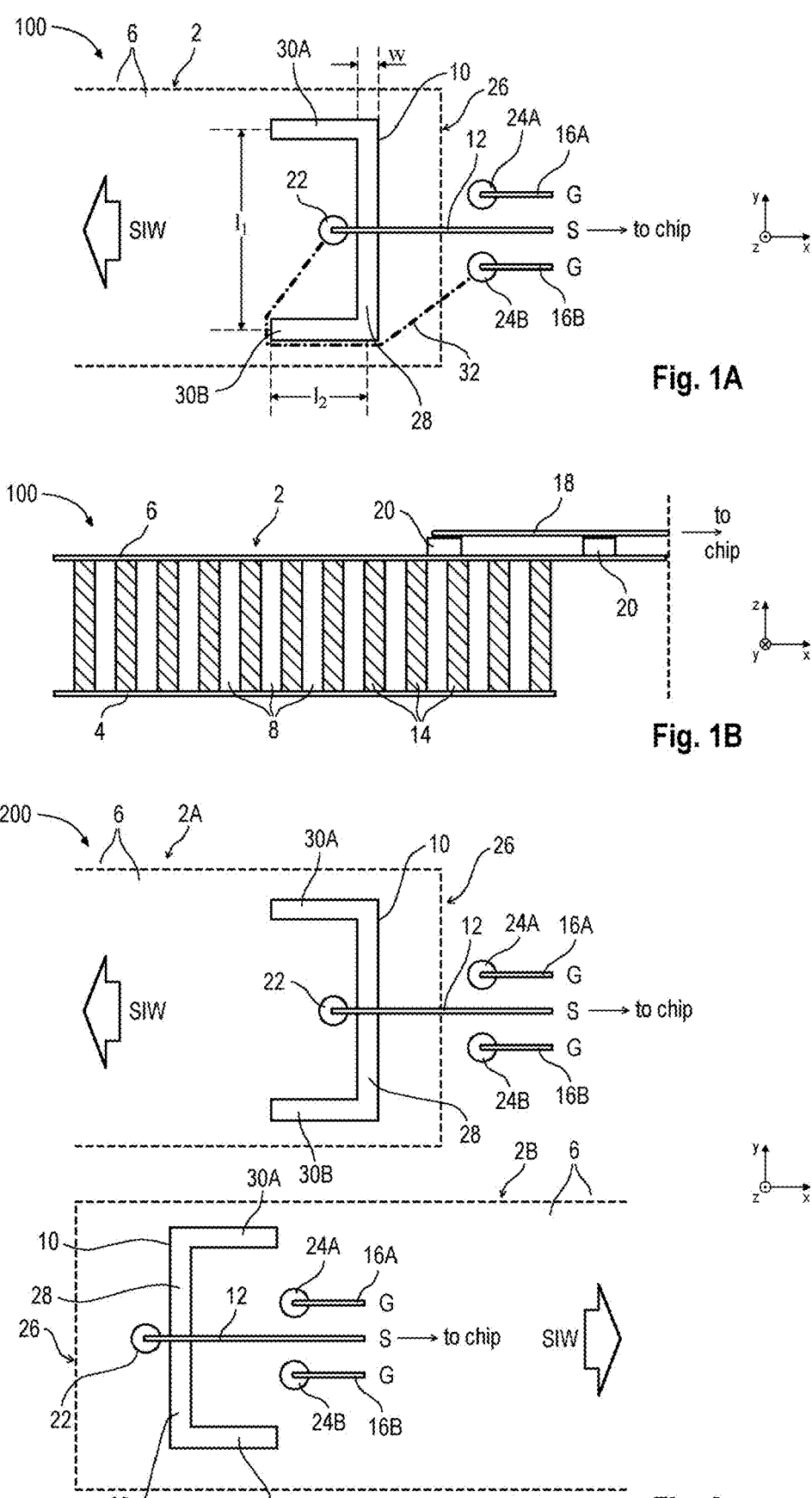
FIGS. 1A and 1B schematically illustrating a top view and a side view of a chip package 100, in accordance with the disclosure.
FIG. 2 schematically illustrates a top view of a chip package 20, in accordance with the disclosure.

The chip package 100 of FIGS. 1A and 1B may include a semiconductor chip (not illustrated) and a substrate integrated waveguide 2. The substrate integrated waveguide 2 may include a first metal layer 4, a second metal layer 6 arranged over the first metal layer 4 and a dielectric substrate 8 arranged between the first metal layer 4 and the second metal layer 6. The first metal layer 4 may be referred to as a bottom metal layer of the substrate integrated waveguide 2, and the second metal layer 6 may be referred to as a top metal layer of the substrate integrated waveguide 2. A slot 10 may be formed in the second metal layer 6. A signal line 12 (see "S") may electrically couple the second metal layer 6 and the semiconductor chip (see "to chip"). The signal line 12 may cross the slot 10 when viewed in a direction perpendicular to the second metal layer 6 (or in a direction perpendicular to a main surface of the substrate integrated waveguide 2).

The semiconductor chip (or electronic circuits thereof) may operate in a frequency range of greater than about 1 GHz, in some examples greater than about 10 GHz. The semiconductor chip may thus also be referred to as radio frequency chip or high frequency chip or microwave frequency chip. In particular, the semiconductor chip may include or may correspond to a monolithic microwave integrated circuit. More particular, the semiconductor chip may operate in a radio frequency range or microwave frequency range, which may range from about 1 GHz to about 1 THz, more particular from about 10 GHz to about 300 GHz. Microwave circuits may include, for example, microwave transmitters, microwave receivers, microwave transceivers, microwave sensors, microwave detectors, etc. Chip packages in accordance with the disclosure may be used for radar applications in which the frequency of the radio frequency signals may be modulated. The semiconductor chip may thus particularly correspond to a radar chip. The semiconductor chip may be at least partially encapsulated by an encapsulation material such as e.g., a molding compound. In particular, the chip package 100 may be a FCBGA (Flip Chip Ball Grid Array) package.

Radar microwave devices may e.g., be used in automotive, industrial, military and/or defense applications for range and speed measuring systems. For example, automotive applications may include advanced driver assistant systems, automatic vehicle cruise control systems, vehicle anti-collision systems, etc. Such systems may operate in the microwave frequency range, for example in the 24 GHZ, 76 GHZ, or 79 GHz frequency bands. A use of radar microwave systems may provide constant and efficient driving of vehicles. An efficient driving style may, for example, reduce fuel consumption such that $CO_2$ emission may be reduced and energy savings may be enabled. In addition, abrasion of vehicle tires, brake discs and brake pads may be reduced, thereby reducing fine dust pollution. Improved radar systems, as specified herein, may thus contribute to green technology solutions, e.g., climate-friendly solutions providing reduced energy usage.

The substrate integrated waveguide 2 may include multiple via connections 14 that may extend between the first metal layer 4 and the second metal layer 6. The via connections 14 may be arranged to form a via fence. The substrate integrated waveguide 2 may be composed of the dielectric substrate 8 covered on both faces by the first metal layer 4 and the second metal layer 6. The dielectric substrate 8 may embed the via connections 14 that may form two parallel rows of metallic via holes delimiting a propagation area of electromagnetic waves that are to be transmitted via the substrate integrated waveguide 2. In the top view of FIG. 1A the propagation area of the substrate integrated waveguide 2 is indicated by an example dashed rectangular form.

The propagating electromagnetic waves may be confined within the dielectric substrate 8 by the metal layers 4 and 6 on each of the two surfaces of the dielectric substrate 8 and between the two rows of metallic vias 14 connecting the metal layers 4 and 6. The substrate integrated waveguide 2 may be configured to transmit electromagnetic waves in a lateral direction, e.g., in the x-y-plane. In the illustrated example, an example direction of a signal transmission via the substrate integrated waveguide 2 is indicated by an arrow pointing to the left (see "SIW").

The chip package 100 may include at least one ground line 16 (see "G") that may electrically couple the second metal layer 6 to a ground potential. In the illustrated example, the signal line 12 may be at least partially sandwiched between an example number of two ground lines 16A and 16B. The signal line 12 and the ground lines 16A, 16B may form a coplanar waveguide. The coplanar waveguide may be configured to transmit signals from the substrate integrated waveguide 2 to the semiconductor chip (see "to chip") and/or vice versa.

The signal line 12 and the ground lines 16A, 16B may be formed in a third metal layer 18 arranged over the second metal layer 6. A signal transmitted via the signal line 12 may thus cross the slot 10 formed in the second metal layer 6 in the third metal layer 18 arranged over the second metal layer 6. Multiple via connections 20 may extend between the second metal layer 6 and the third metal layer 18 and may be configured to electrically couple these metal layers. In particular, the via connections 20 may be configured to electrically couple the signal line 12 and/or the ground lines 16A, 16B with the second metal layer 6.

The signal line 12 may be electrically connected to the second metal layer 6 at a first contact 22 on the second metal layer 6. In addition, the first ground line 16A and the second ground line 16B may be electrically connected to the second metal layer 6 at second contacts 24A and 24B on the second metal layer 6. The slot 10 formed in the second metal layer 6 may be arranged between the first contact 22 and the second contacts 24A, 24B. As will be discussed later on, the slot 10 may be configured to electrically isolate the first contact 22 associated with the signal line 12 from the second contacts 24A, 24B associated with the ground lines 16A, 16B.

During an operation of the chip package 100 signals may be transmitted between the semiconductor chip and the substrate integrated waveguide 2. Frequencies of the transmission signals may have values as previously discussed. In particular, a frequency of the signals may be greater than about 1 GHz. An associated wavelength λ of the signals may have corresponding values. The slot 10 may be configured to couple a signal from the signal line 12 crossing the slot 10 into the substrate integrated waveguide 2. Additionally or alternatively, the slot 10 may be configured to couple a signal from the substrate integrated waveguide 2 into the signal line 12.

Coupling a signal from the signal line 12 into substrate integrated waveguide 2 and/or vice versa may be based on electromagnetic excitation. That is, the slot 10 may be configured to excite a radio frequency electromagnetic wave in the substrate integrated waveguide 2 based on a signal transmitted via the signal line 12. Additionally or alternatively, the slot 10 may be configured to excite a radio frequency electromagnetic wave in the signal line 12 based on a signal transmitted via the substrate integrated waveguide 2.

In the illustrated example, the slot 10 may be formed in a u-shape. That is, in the top view of FIG. 1A, the shape of the slot 10 may resemble the shape of the letter "U". In further examples, the slot 100 may be formed differently, such as e.g., in a v-shape or in a c-shape. The u-shape of the slot 10 may include one or multiple sharp corners and/or one or multiple rounded corners. In the present example, the u-shape may have multiple sharp corners. The slot 10 may include a first portion 28 having a length of l1 and extending in the y-direction as well as two second portions 30A, 30B having a length of l2 and extending in the x-direction. The second portions 30A, 30B may be arranged substantially perpendicular to the first portion 28. In addition, the second portions 30A, 30B may be substantially parallel to each other. The substrate integrated waveguide 2 may have a shortened end 26, wherein an opening of the u-shape may be opposite to the shortened end 26.

The u-shape of the slot 10 may provide a small form factor of the arrangement as compared to an arrangement with a slot having similar total length, but being shaped as a straight line. The concept for feeding the substrate integrated waveguide 2 with radio frequency signals as discussed herein may provide a compact routing of radio frequency signals between the semiconductor chip and the substrate integrated waveguide 2. Furthermore, the feeding concept may provide a compact package design for lowest transmission losses and cost efficiency.

A total length $l_{total}$ of the slot 10 may be approximately n times λ/2, wherein λ is the wavelength of the signal and n is a natural number. In the illustrated example, $l_{total}=l_1+2 \cdot l_2$.

The total length $l_{total}$ of the slot 10 may be adapted to the signal frequency and/or may be used for tuning the frequency. In particular, the total length $l_{total}$ of the slot 10 may be in a range from $\lambda/2$ to $\lambda$.

A width w of the slot 10 may be configured for impedance matching a signal transmission via the substrate integrated waveguide 2 and a signal transmission via the signal line 12. In particular, the width w of the slot 10 may be used for creating an impedance matching between the coplanar waveguide from the side of the semiconductor chip and the substrate integrated waveguide 2 towards the side of a printed circuit board onto which the chip package 100 may be mounted. A width of the slot 10 may be in a range from about 20 μm to about 600 μm.

The slot 10 may be arranged such that a minimum distance 32 (see dot-dashed line) required for a signal to propagate between the first contact 22 associated with the signal line 12 and the second contacts 24A, 24B associated with the ground lines 16A, 16B around the slot 10 may be between $\lambda/2$ and $3\lambda/2$. The minimum distance 32 may not necessarily correspond to a direct distance between the first contact 22 and the second contacts 24A, 24B, but to a shortest distance the signal may need to travel from the first contact 22 to the second contacts 24A, 24B. Stated differently, the minimum distance 32 may correspond to a DC path length between the first contact 22 and the second contacts 24A, 24B.

The minimum distance 32 may be adapted to the wavelength $\lambda$ of the signal such that the slot 10 may be configured to provide an isolation between the first contact 22 and the second contacts 24A, 24B. At the same time, a relative arrangement of the slot 10 and the contacts 22, 24A, 24B may provide an excitation of radio frequency electromagnetic waves in the substrate integrated waveguide 2 based on a signal transmitted via the signal line 12 and vice versa.

It is to be noted that the chip package 100 is illustrated and described in a general manner in order to qualitatively specify aspects of the disclosure. It is understood that the chip package 100 may include further aspects and/or further components which are not illustrated for the sake of simplicity. For example, the chip package 100 may include a launcher configured to couple a signal from the substrate integrated waveguide 2 into a waveguide (such as e.g., an air-filled waveguide) external to the chip package 100 and/or from the waveguide external to the chip package 100 into the substrate integrated waveguide 2. The launcher may include at least one coupling element formed in the first metal layer 4. For example, the coupling element may include or may correspond to one or multiple antennas, such as e.g., patch antennas. The launcher may e.g., be arranged at the end of the substrate integrated waveguide 2 opposite to the shortened end 26.

The chip package 200 of FIG. 2 may include some or all features of the chip package 100 of FIG. 1. The chip package 200 may include a first substrate integrate waveguide 2A similar to FIG. 1 and oriented in a first direction (see arrow "SIW" pointing to the left). In addition, the chip package 200 may include one or multiple further substrate integrated waveguides. In the illustrated example, the chip package 200 may include a second substrate integrated waveguide 2B that may be oriented in an opposite direction (see arrow "SIW" pointing to the right). In particular, the second substrate integrated waveguide 2B may at least partially extend underneath the semiconductor chip when viewed in a direction perpendicular to the second metal layer 6, e.g., in the z-direction.

Figure 3:
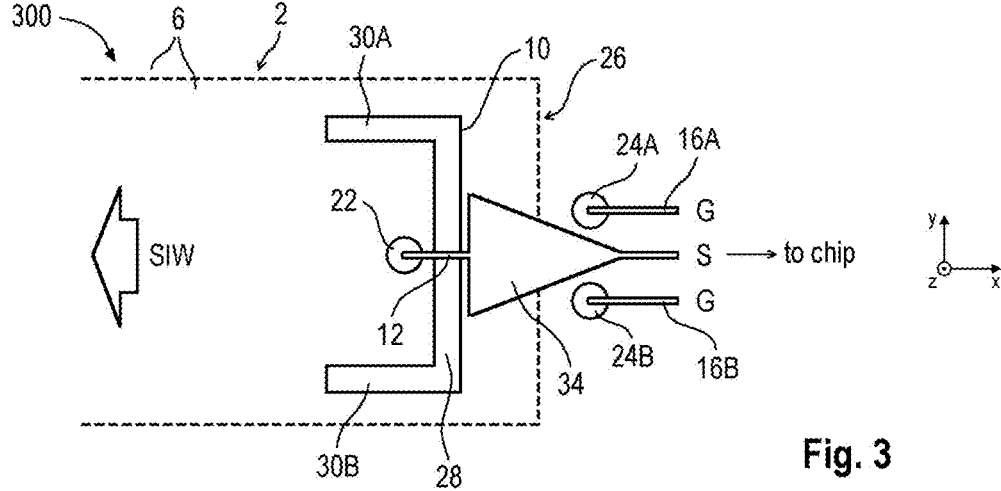
FIG. 3 schematically illustrates a top view of a chip package 300, in accordance with the disclosure.

The chip package 300 of FIG. 3 may include some or all features of previously discussed chip packages. The chip package 300 may include one or multiple matching elements 34 that may be arranged in the signal line 12. In this regard, the matching element(s) 34 may be formed in the third metal layer 18. In the illustrated example, a signal matching element 34 may be a taper or tapered formed included in the signal line 12. Similar or additional to the slot 10, the matching element 34 may be configured for impedance matching a signal transmission via the substrate integrated waveguide 2 and a signal transmission via the signal line 12. In addition, the matching element 34 may be configured for improving a broadband performance.

Figure 4:
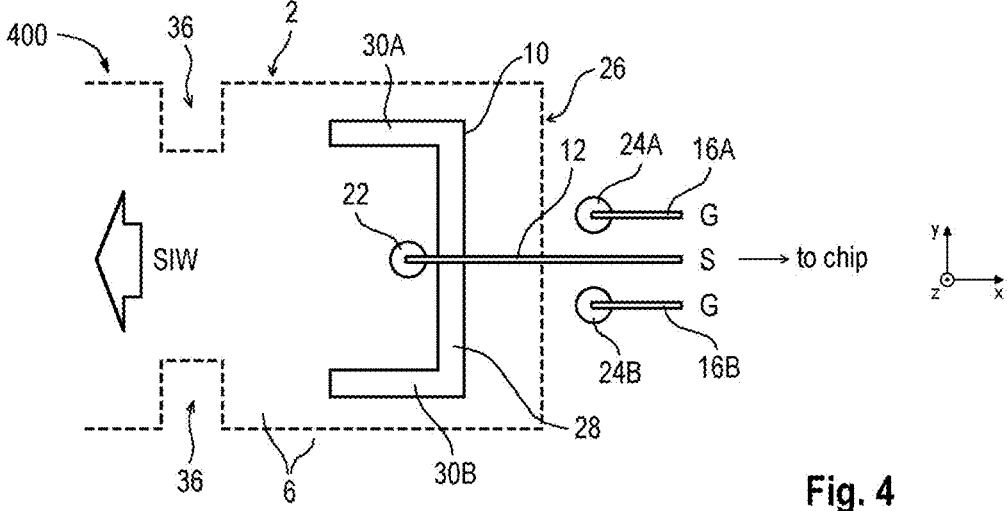
FIG. 4 schematically illustrates a top view of a chip package 400, in accordance with the disclosure.

The chip package 400 of FIG. 4 may include some or all features of previously discussed chip packages. The chip package 400 may include one or multiple matching elements 36 arranged in the substrate integrated waveguide 2. In the illustrated example, the matching elements 36 may include or may correspond to irises realized in the substrate integrated waveguide 2. The irises may be arranged at opposite sides of the substrate integrated waveguide 2. For example, the irises may be formed by discontinuities or notches in the substrate integrated waveguide 2. In the illustrated example, the irises may substantially extend in the y-direction while a transmission direction of the substrate integrated waveguide 2 may substantially extend in the x-direction. Similar or additional to the slot 10 and/or the matching element 34 of FIG. 3, the matching elements 36 of FIG. 4 may be configured for impedance matching and improving broadband performance.

Figure 5:
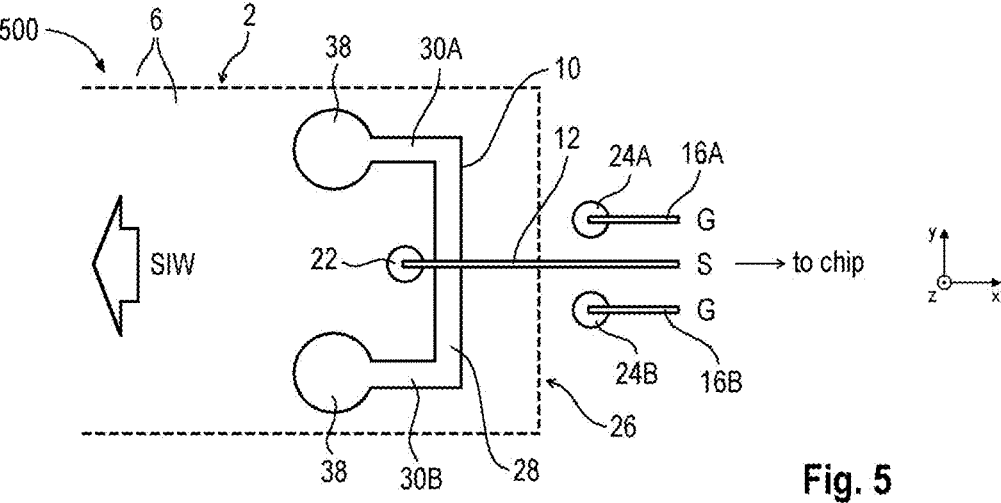
FIG. 5 schematically illustrates a top view of a chip package 500, in accordance with the disclosure.

The chip package 500 of FIG. 5 may include some or all features of previously discussed chip packages. FIG. 5 illustrates a further possible design or geometric shape of the slot 10. The slot 10 may include one or multiple circular shapes 38 that may be arranged at the ends of the second portions 30A of the slot 10. The illustrated slot design may be configured to improve a broadband performance.

The chip package 600 of FIG. 6 may include some or all features of previously discussed chip packages. FIG. 6 illustrates a further possible design or geometric shape of the slot 10. The slot 10 may include one or multiple taper (or conical or triangular) shapes 40 that may be arranged at the ends of the second portions 30A of the slot 10. The illustrated slot design may be configured to improve a broadband performance.

The chip package 700 of FIG. 7 may include some or all features of previously discussed chip packages. FIG. 7 illustrates a further possible design or geometric shape of the slot 10. In the illustrated example, the slot 10 may be formed in a c-shape (or in a semi-circle shape). The illustrated slot design may be configured to improve a broadband performance.

FIG. 8 illustrates a flowchart of a method for manufacturing a chip package in accordance with the disclosure. The method may be used for manufacturing chip packages as previously discussed and may thus be read in connection with any of the foregoing figures. The method of FIG. 8 is described in a general manner in order to qualitatively specify aspects of the disclosure. It is understood that the method may include further aspects. For example, the method may be extended by any of the aspects described in connection with other examples in accordance with the disclosure.

At 42, a substrate integrated waveguide may be generated. The substrate integrated waveguide may include a first metal layer, a second metal layer arranged over the first metal layer and a dielectric substrate arranged between the first metal layer and the second metal layer. At 44, a slot may be formed in the second metal layer. At 46, an electrical coupling of the second metal layer and a semiconductor chip may be provided by a signal line. The signal line may cross the slot when viewed in a direction perpendicular to the second metal layer.

ASPECTS In the following, chip packages including substrate integrated waveguides and methods for manufacturing such chip packages will be explained using aspects.

Aspect 1 is a chip package, comprising: a semiconductor chip; a substrate integrated waveguide, comprising a first metal layer, a second metal layer arranged over the first metal layer and a dielectric substrate arranged between the first metal layer and the second metal layer; a slot formed in the second metal layer; and a signal line electrically coupling the semiconductor chip and the second metal layer, wherein the signal line crosses the slot when viewed in a direction perpendicular to the second metal layer.

Aspect 2 is a chip package according to Aspect 1, wherein the substrate integrated waveguide comprises via connections extending between the first metal layer and the second metal layer.

Aspect 3 is a chip package according to Aspect 1 or 2, wherein the slot is configured to: couple a signal from the signal line into the substrate integrated waveguide, and/or couple a signal from the substrate integrated waveguide into the signal line.

Aspect 4 is a chip package according to one of the preceding Aspects, wherein the slot is configured to: excite a radio frequency electromagnetic wave in the substrate integrated waveguide based on a signal transmitted via the signal line, and/or excite a radio frequency electromagnetic wave in the signal line based on a signal transmitted via the substrate integrated waveguide.

Aspect 5 is a chip package according to one of the preceding Aspects, further comprising: at least one ground line electrically coupling the second metal layer to a ground potential.

Aspect 6 is a chip package according to Aspect 5, wherein the signal line and the at least one ground line form a coplanar waveguide.

Aspect 7 is a chip package according to Aspect 5 or 6, wherein the signal line and the at least one ground line are formed in a third metal layer arranged over the second metal layer.

Aspect 8 is a chip package according to Aspect 7, further comprising: via connections extending between the second metal layer and the third metal layer.

Aspect 9 is a chip package according to one of Aspects 5 to 8, wherein: the signal line is electrically connected to the second metal layer at a first contact on the second metal layer, the at least one ground line is electrically connected to the second metal layer at a second contact on the second metal layer, and the slot is arranged between the first contact and the second contact.

Aspect 10 is a chip package according to Aspect 9, wherein the slot is arranged such that a minimum distance required for a signal to propagate between the first contact and the second contact around the slot is between $\lambda/2$ and $3\lambda/2$, wherein A is the wavelength of the signal.

Aspect 11 is a chip package according to one of the preceding Aspects, wherein a total length of the slot is approximately n times $\lambda/2$, wherein $\lambda$ is the wavelength of the signal and n is a natural number.

Aspect 12 is a chip package according to one of the preceding Aspects, wherein a total length of the slot is in a range from $\lambda/2$ to $\lambda$, wherein $\lambda$ is the wavelength of the signal.

Aspect 13 is a chip package according to one of the preceding Aspects, wherein a width of the slot is configured for impedance matching a signal transmission via the substrate integrated waveguide and a signal transmission via the signal line.

Aspect 14 is a chip package according to one of the preceding Aspects, wherein a width of the slot is in a range from 20 $\mu$m to 600 $\mu$m.

Aspect 15 is a chip package according to one of the preceding Aspects, wherein the slot is formed in a u-shape.

Aspect 16 is a chip package according to Aspect 15, wherein the substrate integrated waveguide has a shortened end, and wherein an opening of the u-shape is opposite to the shortened end of the substrate integrated waveguide.

Aspect 17 is a chip package according to one of the preceding Aspects, further comprising: a launcher configured to couple a signal from the substrate integrated waveguide into a waveguide external to the chip package and/or from the waveguide external to the chip package into the substrate integrated waveguide.

Aspect 18 is a chip package according to Aspect 17, wherein the launcher comprises at least one coupling element formed in the first metal layer.

Aspect 19 is a chip package according to one of the preceding Aspects, wherein the substrate integrated waveguide at least partially extends underneath the semiconductor chip when viewed in a direction perpendicular to the second metal layer.

Aspect 20 is a chip package according to one of the preceding Aspects, wherein a frequency of the signal is greater than 1 GHz and the semiconductor chip comprises a monolithic microwave integrated circuit.

Aspect 21 is a chip package according to one of the preceding Aspects, wherein the chip package is a flip chip ball grid array package.

Aspect 22 is a chip package according to one of the preceding Aspects, further comprising: at least one of a matching element arranged in the signal line or a matching element arranged in the substrate integrated waveguide.

Aspect 23 is a method for manufacturing a chip package, wherein the method comprises: generating a substrate integrated waveguide, comprising a first metal layer, a second metal layer arranged over the first metal layer and a dielectric substrate arranged between the first metal layer and the second metal layer; forming a slot in the second metal layer; and providing an electrical coupling of the second metal layer and a semiconductor chip by a signal line, wherein the signal line crosses the slot when viewed in a direction perpendicular to the second metal layer.

As employed in this specification, the terms "connected", "coupled", "electrically connected", and/or "electrically coupled" may not necessarily mean that elements must be directly connected or coupled together. Intervening elements may be provided between the "connected", "coupled", "electrically connected", or "electrically coupled" elements.

Further, the word "over" used with regard to e.g., a material layer formed or located "over" a surface of an object may be used herein to mean that the material layer may be located (e.g., formed, deposited, etc.) "directly on", e.g., in direct contact with, the implied surface. The word "over" used with regard to e.g., a material layer formed or located "over" a surface may also be used herein to mean that the material layer may be located (e.g., formed, deposited, etc.) "indirectly on" the implied surface with e.g., one or multiple additional layers being arranged between the implied surface and the material layer.

Furthermore, to the extent that the terms "having", "containing", "including", "with", or variants thereof are used in either the detailed description or the claims, such terms are intended to be inclusive in a manner similar to the term "comprising". That is, as used herein, the terms "having", "containing", "including", "with", "comprising", and the like are open-ended terms that indicate the presence of stated elements or features, but do not preclude additional elements or features. The articles "a", "an", and "the" are intended to include the plural as well as the singular, unless the context clearly indicates otherwise.

Moreover, the word "example" is used herein to mean serving as an example, instance, or illustration. Any aspect or design described herein as "example" is not necessarily to be construed as advantageous over other aspects or designs. Rather, use of the word example is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

Although the disclosure has been shown and described with respect to one or multiple implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or multiple other features of the other implementations as may be desired and advantageous for any given or particular application.

10

The invention claimed is:

1. A chip package, comprising:
   a semiconductor chip;
   a substrate integrated waveguide, comprising a first metal layer, a second metal layer arranged over the first metal layer, and a dielectric substrate arranged between the first metal layer and the second metal layer;
   a slot formed in the second metal layer; and
   a signal line electrically coupling the semiconductor chip and the second metal layer, wherein the signal line crosses the slot when viewed in a direction perpendicular to the second metal layer,
   wherein a frequency of a signal transmitted via the signal line and/or a signal transmitted via the substrate integrated waveguide is greater than 1 GHz, and
   wherein the semiconductor chip comprises a monolithic microwave integrated circuit.

2. The chip package of claim 1, wherein the substrate integrated waveguide comprises via connections extending between the first metal layer and the second metal layer.

3. The chip package of claim 1, wherein the slot is configured to:
   couple a signal from the signal line into the substrate integrated waveguide, and/or
   couple a signal from the substrate integrated waveguide into the signal line.

4. The chip package of claim 1, wherein the slot is configured to:
   excite a radio frequency electromagnetic wave in the substrate integrated waveguide based on a signal transmitted via the signal line, and/or
   excite a radio frequency electromagnetic wave in the signal line based on a signal transmitted via the substrate integrated waveguide.

5. The chip package of claim 1, further comprising:
   at least one ground line electrically coupling the second metal layer to a ground potential,
   wherein the signal line and the at least one ground line form a coplanar waveguide.

6. The chip package of claim 5, wherein the signal line and the at least one ground line are formed in a third metal layer arranged over the second metal layer, and
   wherein the chip package further comprises:
   via connections extending between the second metal layer and the third metal layer.

7. The chip package of claim 5, wherein:
   the signal line is electrically connected to the second metal layer at a first contact on the second metal layer,
   the at least one ground line is electrically connected to the second metal layer at a second contact on the second metal layer, and
   the slot is arranged between the first contact and the second contact.

8. The chip package of claim 7, wherein the slot is arranged such that a minimum distance required for a signal to propagate between the first contact and the second contact around the slot is between $\lambda/2$ and $3\lambda/2$, wherein $\lambda$ is the wavelength of a signal transmitted via the signal line and/or a signal transmitted via the substrate integrated waveguide.

9. The chip package of claim 1, wherein a total length of the slot is approximately n times $\lambda/2$, wherein $\lambda$ is a wavelength of a signal transmitted via the signal line and/or a signal transmitted via the substrate integrated waveguide and n is a natural number.

10. The chip package of claim 1, wherein a total length of the slot is in a range from $\lambda/2$ to $\lambda$, wherein $\lambda$ is a wavelength of a signal transmitted via the signal line and/or a signal transmitted via the substrate integrated waveguide.

11. The chip package of claim 1, wherein a width of the slot is configured for impedance matching a signal transmission via the substrate integrated waveguide and a signal transmission via the signal line.

12. The chip package of claim 1, wherein the slot is formed in a u-shape.

13. The chip package of claim 12, wherein the substrate integrated waveguide has a shortened end, and wherein an opening of the u-shape is opposite to the shortened end of the substrate integrated waveguide.

14. The chip package of claim 1, further comprising:
a launcher configured to couple a signal from the substrate integrated waveguide into a waveguide external to the chip package and/or from the waveguide external to the chip package into the substrate integrated waveguide.

15. The chip package of claim 14, wherein the launcher comprises at least one coupling element formed in the first metal layer.

16. The chip package of claim 1, wherein the substrate integrated waveguide at least partially extends underneath the semiconductor chip when viewed in a direction perpendicular to the second metal layer.

17. The chip package of claim 1, wherein the chip package is a flip chip ball grid array package.

18. The chip package of claim 1, further comprising:
at least one of a matching element arranged in the signal line or a matching element arranged in the substrate integrated waveguide.

19. A method for manufacturing a chip package, wherein the method comprises:
generating a substrate integrated waveguide, comprising a first metal layer, a second metal layer arranged over the first metal layer and a dielectric substrate arranged between the first metal layer and the second metal layer;
forming a slot in the second metal layer; and
providing an electrical coupling of the second metal layer and a semiconductor chip by a signal line, wherein the signal line crosses the slot when viewed in a direction perpendicular to the second metal layer,
wherein a frequency of a signal transmitted via the signal line and/or a signal transmitted via the substrate integrated waveguide is greater than 1 GHz, and
wherein the semiconductor chip comprises a monolithic microwave integrated circuit.

* * * * *